United States Patent [19]
Sugihara

[11] Patent Number: 6,091,066
[45] Date of Patent: Jul. 18, 2000

[54] CONTAMINATION-TOLERANT SWITCH STRUCTURE

[75] Inventor: Reiji Sugihara, Tokyo, Japan

[73] Assignee: Aruze Corporation, Tokyo, Japan

[21] Appl. No.: 09/069,577

[22] Filed: Apr. 29, 1998

[30] Foreign Application Priority Data

Aug. 29, 1997 [JP] Japan ..................................... 9-234862

[51] Int. Cl.[7] ............................ H01H 3/12; H01H 13/02; G01D 5/34
[52] U.S. Cl. ............................................. 250/229; 200/345
[58] Field of Search .................................. 250/229, 239, 250/216; 200/61.1, 61.19, 453, 457, 293, 302.1, 302.2, 306, 329, 341, 345

[56] References Cited

U.S. PATENT DOCUMENTS

| | | | |
|---|---|---|---|
| 5,047,628 | 9/1991 | Schmidt et al. | 250/229 |
| 5,413,358 | 5/1995 | Austin, Jr. et al. | 200/302.2 |
| 5,612,521 | 3/1997 | Bistekos | 250/229 |
| 5,883,459 | 3/1999 | Cline et al. | 200/181 |
| 5,921,381 | 7/1999 | Von Arx | 200/345 |

*Primary Examiner*—John R Lee
*Attorney, Agent, or Firm*—Rohm & Monsanto, P.L.C.

[57] ABSTRACT

A switch structure that is particularly suited for gaming equipment is tolerant of the spillage of food or of contamination resulting from beverage, or continued operation thereof by individuals with soiled hands. The switch structure has an actuatable member having an manipulable portion and a tube extending from the manipulable portion in the direction to be pushed. A protuberance is installed in a core of the tube and arranged to guide the motion of the actuatable member in response to the application of a pushing force to the manipulable portion thereof. A switch is provided for producing a variation in an electrical condition in response to the actuatable member being pushed. A support element has a recess for accommodating therein the actuatable member, there remaining a space surrounding the periphery of the actuatable member sufficient to accommodate contaminants. The space surrounding the periphery of the actuatable member permits contaminants to pass to the bottom of the recess without adhering to the actuatable member. The protuberance is protected from contamination that would enter from the outside by virtue of its being installed in the core space of the tube that smoothly guides the motion of the actuatable member.

5 Claims, 3 Drawing Sheets

CONTAMINATION-TOLERANT SWITCH STRUCTURE

BACKGROUND OF THE INVENTION

1. Field of the Invention

This invention relates generally to switch structures, and more particularly, to a structure for a push button switch for use with instruments or machines particularly gaming machines.

2. Description of the Related Art

In a conventional gaming machine, as a slot machine, the rotation of a plurality of reels is stopped in response to the actuation of push button switch by a player. The winning a prize may be lost by a momentary delay in the operation of push button switch. Quickness in the operation of push button switch influences the results that can be achieved in the playing of the game.

It is a problem in commercial amusement centers that players will operate the gaming machines while foreign substances are on their hands. The foreign substances are present, for example, because the equipment is often operated while the players are eating or drinking. Thus, the operation of gaming machines, particularly the actuation of the push buttons thereof, with soiled hands results in contaminating material, such as food and beverage, entering into the into the gaps surrounding the actuation portion of the push button, and the push button itself being soiled. Food and beverage often are spilled directly on the push buttons on the gaming equipment. Insects are another cause of contamination of the push buttons of such machines. Insects easily enter and die in the gaps that surround the push button. These and other contaminating elements result in erratic operation of the button operation and loss of player control over the game.

When it is determined that the actuation of the push button cannot smoothly be performed or its operation adequately controlled by the operator, the push button unit must be removed from the gaming machine and cleaned. Such maintenance is expensive and troublesome, and results in significant machine down time. In addition, erratic or difficult operation of the gaming machine causes the players to lose interest in the game and the gaming machine itself, resulting in loss of clientele to the gaming establishment and low utilization efficiency for the equipment.

There is therefore, a need for a switch structure that is tolerant of contaminants. The prior art has thrust at this problem by decreasing the gap space surrounding the actuation portion of the push button of the switch structure. This switch structure prevents large sized contaminating materials from entering the decreased gap. However, small sized or liquid contaminating materials can penetrate into the gap, and the gap tends to become filled with the contaminating materials that disturb smooth operation of the push button switch.

SUMMARY OF THE INVENTION

It is, therefore, an object of the present invention is to provide a switch structure that is tolerant of food and/or beverage spills thereon, and of the effects of players that play with soiled hands.

The foregoing and other objects are achieved by this invention which provides a switch structure having an actuatable member having an manipulable portion and a tube extending from the manipulable portion in the direction to be pushed, a protuberance installed in a core of the tube and arranged to guide a motion of the actuatable member in response to the application of a pushing force on the manipulable portion thereof, switch means for producing a variation in an electrical condition in response to the actuatable member being pushed, and a support element having a recess therein for accommodating the actuatable member, there remaining a space surrounding the periphery of the actuatable member sufficient to accommodate contaminants.

In the switch structure of this invention, the protuberance is installed in the core space of the tube of the actuatable member and is arranged to guide a motion of the actuatable member in response to the application of a pushing force on the manipulable portion thereof. In this regard, the space between the internal face of the tube and the external face of the protuberance may be determined so as to effect stable movement of the actuatable member and elimination of vibration.

The internal surface of the tube is arranged to be parallel to the external surface of the protuberance, so that both such surfaces are not accessible by the contamination that enters the switch structure from the outside. Therefore, if a player spills food or drink, such contaminants will not enter between the tube and the protuberance.

In one embodiment of this invention, a large amount of space encircles the periphery of the actuatable member. This is contrary to known arrangements. The space is useful to permit contaminants, such as food or drink, or dead insects that enter therein to pass to the bottom of the recess. As a result, it will be less likely for the contaminants adhere to the surface of the actuatable member, resulting in smooth actuation of the actuatable member.

A switch, illustratively in the form of a photoelectric system, will provide an electrical response to the actuaction of the actuatable member. In a specific illustrative embodiment of this invention, a photo-sensor arrangement provides an optical path that is interrupted in response to the movement of the actuatable member. In other embodiments, conductive switching contacts can be employed. Thus, the switch structure of this invention can produce an effective switching action.

In embodiments of this invention where a penetration aperture is formed through the core of the protuberance, a lighting element such as a light-emitting diode is positioned in the actuatable member through the penetration aperture of the protuberance to illuminate the manipulable portion.

In accordance with an advantageous embodiment of this invention, a switch structure is provided with an actuatable member having a manipulable portion arranged to be pushed by an operator. A tube is arranged to extend from the manipulable portion in the direction to be pushed, a support element having a protuberance disposed in the core space of the tube and functions as a guide for the movement of the actuatable member. A switch that initiates a change in response to movement of the actuatable member functions directly or indirectly to produce a change in an electrical response characteristic responsive to the pushing of the manipulable portion. The actuatable member is restored to its original position after being pushed and released by a the operator by restoring force applied by a resilient element, such as a spring. The protuberance is disposed within a recess in a support element. A relatively large space, sufficient to permit contaminants to pass therethrough, encircles the periphery of the tube of the actuatable member.

BRIEF DESCRIPTION OF THE DRAWING

The foregoing and other objects, features, and advantages of the invention will become more apparent from the following detailed description taken in conjunction with the accompanying drawings, in which.

DETAILED DESCRIPTION

Figure 1:
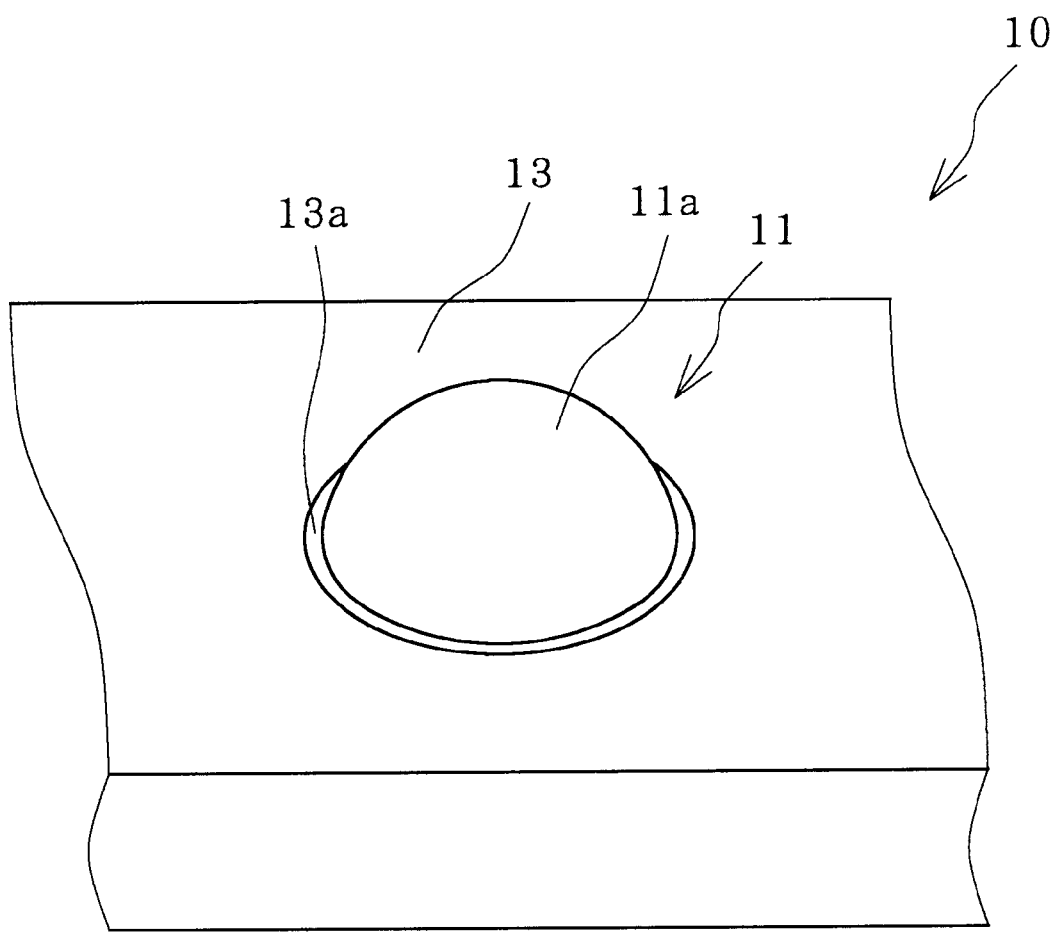
FIG. 1 is an isometric representation of an illustrative embodiment of switch structure constructed in accordance with the principles of the invention.
Figure 2:
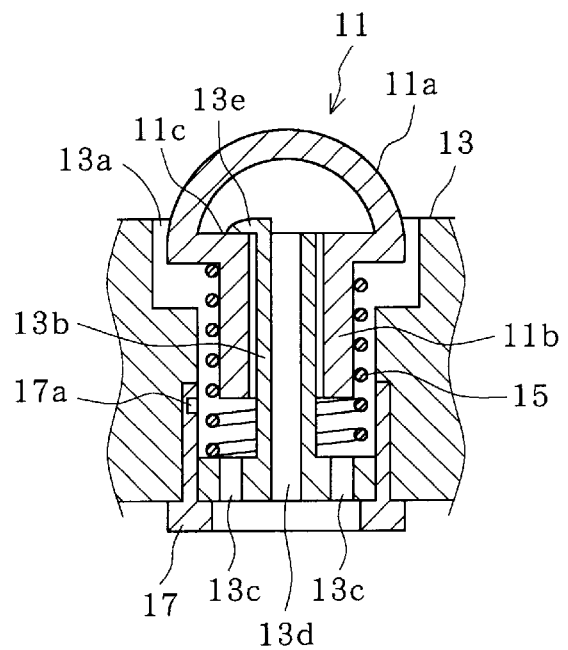
FIG. 2 is cross-sectional plan representation of the switch structure of FIG. 1.
Figure 3:
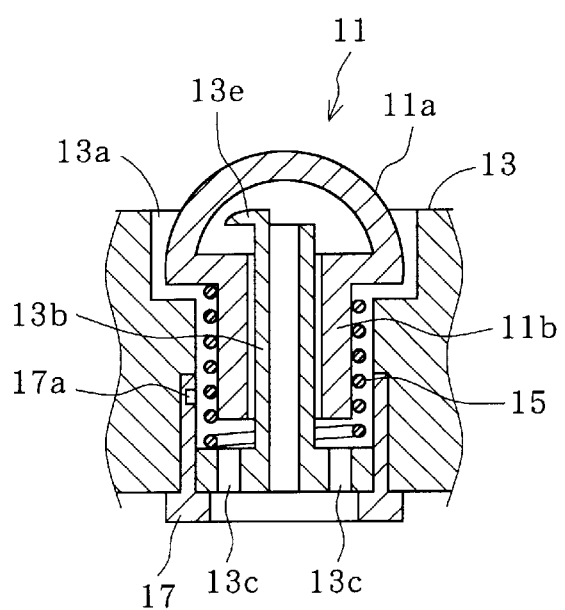
FIG. 3 is cross-sectional plan representation of the switch structure of FIG. 1.

FIG. 1 is an isometric representation of a specific illustrative embodiment of a switch structure 10 constructed in accordance with the invention. FIG. 2 and FIG. 3 are cross-sectional plan representation thereof, respectively.

Switch structure 10 is provided with actuatable member 11 having an manipulable portion 11a, a support element 13, and a photo-sensor arrangement 17.

As shown in FIG. 2, the actuatable member 11 is shaped like a mushroom having a substantially cylindrical portion 11b extending downward from manipulable portion 11a. The actuatable member 11 has an internal volume that also is shaped like a mushroom.

Support element 13 has a recess 13a that accommodates actuatable member 11. Recess 13a is shaped stepwise in correspondence with mushroom-shaped actuatable member 11, and has a diameter such that actuatable member 11 is accommodated therein and is encircled by a space, as shown in drawing.

A protuberance 13b projects upward (outward) from the bottom central region of recess 13a.

The outside diameter of protuberance 13b is slightly smaller than the inside diameter of the substantially cylindrical portion 11b. When the manipulable portion is pushed, the substantially cylindrical portion 11b is translated smoothly along protuberance 13b without vibration. Protuberance 13b functions as a guide for the movement of actuatable member Substantially cylindrical portion 11b is surrounded by a coil spring 15 and is disposed directly over protuberance 13b in recess 13a of support element 13.

As shown in FIGS. 2 and 3, a considerable amount of space encircles the periphery of actuatable member 11 in recess 13a of support element 13. In this embodiment, coil spring 15 is accommodated in this extra space, but additional space remains. Such additional space is useful to accommodate contaminants such as food, drink, or insects that entered the space that encircles the periphery of actuatable member 11 and that pass to the bottom of the recess 13a. The encircling space is sufficiently large to permit such contaminants to pass without causing adhesive between the surface of actuatable member 11 and the inner surface of recess 13a.

A plurality of outlet apertures 13c is formed on the bottom of recess 13a. Contaminants such as food, drink, and dead insects that have entered into recess 13a are discharged through outlet apertures 13c.

Protuberance 13b has a penetration aperture 13d that extends through its core and projects from the center of the bottom surface of recess 13a of support element 13. In a still further embodiment, a lighting member (not shown) is inserted therethrough to illuminate actuatable member 11.

At least one expanding portion 13e is arranged to project outward from the top of protuberance 13b. Expanding portion 13e is disposed over the core space of substantially cylindrical portion 11b and arranged to limit the outward extent that upper surface 11c disposed in the mushroom shaped inner space of actuatable member 11 travels. Actuatable member 11 is retained by expanding portion 13e of protuberance 13b in an outward most condition in response to the restoring force applied by coil spring 15.

Expanding portion 13e may be shaped in the form of a ring in embodiments where protuberance 13b is configured to be inserted into core space of the substantially cylindrical portion 11b.

As shown in FIG. 3, actuatable member 11 can be moved downward, when manipulable portion 11a is pushed down against the force of coil spring 15.

In this embodiment, a photo-sensor 17 is used as a switch installed in recess 13a of support element 13.

Figure 4:
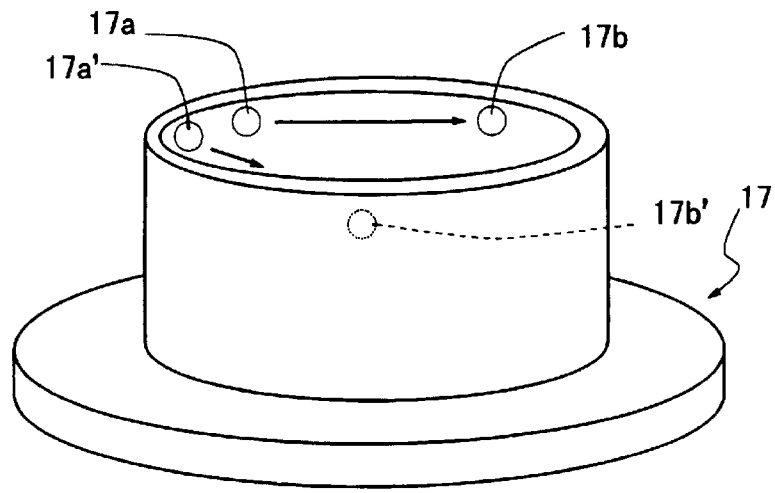
FIG. 4 is an isometric representation of a photo-sensor arrangement used in the switch structure of FIG. 1.

As shown in FIG. 4, photo-sensor 17 has a cylindrical shape having an upper opening. In this embodiment, photo-sensor 17 forms two optical paths between portions 17a and 17b and between portions 17a' and 17b' at upper positions of the inner wall thereof.

Figure 5:
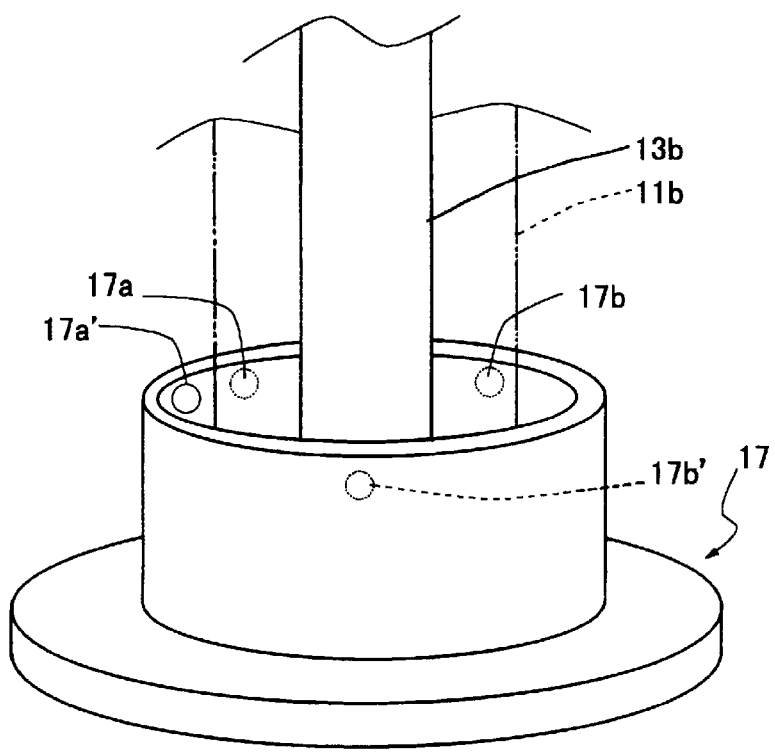
FIG. 5 is an isometric representation of a photo-sensor arrangement used in the switch structure of FIG. 1.

As shown in FIG. 5, the optical paths are not interrupted by protuberance 13b, but instead the optical paths are interrupted by cylindrical portion 11b of actuatable member 11. In this embodiment, the photo-sensor can maintain an electrical signal in its original condition even if either of the optical paths is interrupted, such as by contamination.

In the above-mentioned structure, when manipulable portion 11a of actuatable member 11 is pushed down against the force of coil spring 15, cylindrical portion 11b also moves downward to interrupt and thereby shut off both optical paths of photo-sensor 17. A corresponding electrical signal (not shown) is produced by photo-sensor 17. When the actuation force is eliminated, actuatable member 11 returns to its former position in response to the restoring force of coil spring 15 and cylindrical portion 11b moves upward. The electrical signal from photo-sensor 17 returns to its original condition. Thus, cylindrical portion 11b and photo-sensor 17 constitute a switching arrangement that is synchronized with movement of the push button.

In a still further embodiment, the photo-sensor forms an optical path between a portion provided at inner surface of recess and a portion provided at the outer surface of the the protuberance 13b.

In some embodiments of the invention, the switching portion of the arrangement may include electrical contacts such as a leaf switch, wherein the electrical terminals are urged into, or out of, electrical communication in response to the actuation of the push button.

The practice of the present invention involves providing a large relatively amount of space surrounding the periphery of the actuatable member. Such peripheral space is dimensioned such that spilled food or drink, or dead insects, easily pass through the peripheral space and into the bottom of the recess that accommodates the actuatable member. Since the peripheral space prevents the actuatable member from binding against, or adhering to, the internal surface of the recess, the actuable member is permitted to move smoothly along the protuberance 13b installed inside thereof. Accordingly, the actuation of the actuatable member 11 is not adversely affected by contaminants.

Although the invention has been described in terms of specific embodiments and applications, persons skilled in the art can, in light of this teaching generate additional embodiments without exceeding the scope or departing from the spirit of the claimed invention. Accordingly, it is to be understood that the drawing and description in this disclosure are proffered to facilitate comprehension of the invention, and should not be construed to limit the scope thereof.

The entire disclosure of Japanese Patent Application No. 9-234862 filed on Aug. 29, 1997 including specification, claims, drawings and summary are incorporated herein by reference in its entirety.

What is claimed is:

1. A switch structure for manipulation by an operator in a predetermined direction, the switch structure being tolerant of contaminants and comprising:

an actuatable member having a manipulable portion with a peripheral portion therearound and a tube extending from the manipulable portion in the predetermined direction;

a protuberance installed in a core of the tube and arranged to guide the motion of the actuatable member in response to a pushing force applied to the manipulable portion in response to the manipulation by the operator;

a switch arrangement for producing a variation in an electrical characteristic in response to the manipulation by the operator; and a support element having a recess therein for accommodating the actuatable member, there remaining a space surrounding the peripheral portion of the actuatable member, the space being dimensioned to accommodate the contaminants.

2. The switch structure of claim 1, wherein said protuberance is provided with an aperture in its core arranged to extend in the predetermined direction.

3. The switch structure of claim 1, wherein said switch arrangement is provided with a photo-sensor having at least one optical path that is blocked in response to the manipulation by the operator.

4. The switch structure of claim 1, wherein the recess has a bottom portion with an outlet aperture formed therethrough for releasing the contaminants.

5. A contaminant-tolerant switch structure comprising;

an actuatable member having a manipulable portion arranged to be moved from a first position in response to a pushing force applied in a predetermined direction, the manipulable portion having a peripheral portion therearound;

a tube extending from the manipulable portion in the predetermined direction;

a protuberance installed in a core of the tube and arranged to guide the motion of the actuatable member in response to the application of the pushing force to the manipulable portion;

a switch arrangement for producing a variation in an electrical characteristic in response to the movement of the actuatable member;

a resilient restoration element for applying a restoration force that restores the actuatable member to the first position upon discontinuation of the pushing force; and a support element having a recess therein for accommodating the actuatable member, there remaining in the recess a space surrounding the peripheral portion of the actuatable member, the space being dimensioned to accommodate the contaminants.

* * * * *